US006762948B2

United States Patent
Kyun et al.

(10) Patent No.: US 6,762,948 B2
(45) Date of Patent: Jul. 13, 2004

(54) SEMICONDUCTOR MEMORY DEVICE HAVING FIRST AND SECOND MEMORY ARCHITECTURE AND MEMORY SYSTEM USING THE SAME

(75) Inventors: Kye-hyun Kyun, Suwon (KR); Byung-sick Moon, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/268,592

(22) Filed: Oct. 10, 2002

(65) Prior Publication Data

US 2003/0076702 A1 Apr. 24, 2003

(30) Foreign Application Priority Data

Oct. 23, 2001 (KR) ........................................ 2001-65450

(51) Int. Cl.[7] ................................................ G11C 5/02
(52) U.S. Cl. .................................... 365/51; 365/230.03
(58) Field of Search .............................. 36/230.03, 120, 36/51

(56) References Cited

U.S. PATENT DOCUMENTS 5,617,554 A * 4/1997 Alpert et al. ................ 711/208
6,621,746 B1 * 9/2003 Aasheim et al. ......... 365/185.29

* cited by examiner

Primary Examiner—M. Tran
(74) Attorney, Agent, or Firm—Mills & Onello, LLP

(57) ABSTRACT

A semiconductor memory device having first and second memory architectures with different structures and allowing the possibility of selecting any one of the first and second memory architectures using a selection process and a memory system using the semiconductor memory device are provided. The first memory architecture has p banks, a page size of m/2 bytes of m/2 memory cells connected to one word line in each of the banks, and n/2 data terminals DQ. The second memory architecture has p banks, a page size of m bytes, and n data terminals. The option process may be realized by a bonding, a mask pattern, or a fuse. In a memory device, the page size and the number of memory banks are adjusted by a design option. Thus, the memory architecture is modified, redundancy flexibility is increased and power consumption is reduced.

12 Claims, 4 Drawing Sheets

SEMICONDUCTOR MEMORY DEVICE HAVING FIRST AND SECOND MEMORY ARCHITECTURE AND MEMORY SYSTEM USING THE SAME

BACKGROUND OF THE INVENTION

1. Field of the Invention

The present invention relates to a memory device, and more particularly, to a memory device, the architecture of which is easily modified, having high redundancy flexibility, and low power consumption.

2. Description of the Related Art

Today's multimedia development often requires having several specific applications simultaneously. For this and other reasons, the speed of operation of the CPU of high-performance computer systems has constantly increased, and also for this reason SDRAMs having a high bandwidth and a multi-bank structure have been developed.

Most SDRAMs currently used have a maximum frequency of about 133 MHz, which is considerably low compared to the CPU operation speed. Also, since a memory cell of a SDRAM is composed of one transistor and one capacitor like a memory cell of a DRAM, there is a certain limitation in reducing the time required for writing and reading data. The SDRAM generally has an internal four-bank structure, but the bandwidth of the SDRAM is not large enough to process the CPU-required data. Thus, a bottleneck phenomenon occurs in many computer systems.

In order to avoid this and further prevent the performance of computer systems from being degraded, the SDRAM bandwidth is generally increased by a prefetch method. In the prefetch method, (n×m) data obtained by multiplying n external DQ pads by m data in a memory cell array block is read all at once in a reading operation of the SDRAM. Next, m data are sequentially output in each of the n external DQ pads in a pipeline type operation by synchronizing the (n×m) data with an external clock signal. Also, data is received m times from each of the n external DQ pads in the writing operation of the SDRAM and written in a memory cell array all at once.

However, by increasing the bandwidth using the prefetch method, the column redundancy flexibility is reduced. This is because in column redundancy, if a memory cell selected from one memory bank is defective, bit lines of this defective memory cell are replaced with bit lines of a redundant memory cell. However, if the number of memory cells selected at a time increases to m, it is insufficient to merely replace the defective memory cells with limited redundant memory cells.

A way of overcoming reducing the column redundancy flexibility is by increasing a page size. The page size represents the number of memory cells activated by a one-time row access. In other words, the page size represents the number of sense amplifiers operated by one word line. The memory cells operated by one word line are set to be activated in two memory banks, and thus the column redundancy flexibility in each of the memory banks is not changed. However, this method of increasing the page size consumes a large amount of power since sense amplifiers in two memory banks operate.

Accordingly, a memory device capable of increasing redundancy flexibility and reducing power consumption is required.

SUMMARY OF THE INVENTION

To solve the above-described problems, it is a first object of the present invention to provide a memory device capable of maintaining uniform redundancy flexibility and reducing power consumption.

It is a second object of the present invention to provide a memory system having a memory module with the memory device.

In accordance with the invention, there is provided a semiconductor memory device including first and second memory architectures. The first memory architecture has p banks, a page size of m/2 bytes of m/2 memory cells connected to one word line in each of the banks, and n/2 data terminals DQ. The second memory architecture has p banks, a page size of m bytes, and n data terminals.

In one embodiment, one of the first memory architecture and the second memory architecture is selected using an option process.

A semiconductor memory device according to another embodiment includes first and second memory architectures. The first memory architecture has p banks, a page size of m/2 bytes of m/2 memory cells connected to one word line in each of the memory banks, and n/2 data terminals DQ. The second memory architecture has p/2 banks, a page size of m bytes, and n data terminals.

If the first memory architecture includes p/2 memory banks, the second memory architecture includes p memory banks.

Preferably, the option process is realized by a bonding, a mask pattern, or a fuse.

In accordance with another aspect of the invention, there is provided a memory system. The memory system includes a memory controller, a first memory module, and a second memory module. The first memory module is connected to the memory controller via data bus lines and includes i memory devices. The second memory module is connected to the memory controller via the data bus lines and includes i/2 memory devices. Each of the memory devices of each of the first and second memory modules includes first and second memory architectures. The first memory architecture is selected by the memory devices of the first memory module, and the second memory architecture is selected by the memory devices of the second memory module. The first memory architecture has p memory banks, a page size of m/2 bytes of m/2 memory cells connected to one word line in each of the memory banks, and n/2 data terminals DQ. The second memory architecture has p or p/2 memory banks, a page size of m bytes, and n data terminals DQ.

Preferably, the option process is realized by a bonding, a mask pattern, or a fuse.

The page size and the number of memory banks are adjusted by a design option. Thus, redundancy flexibility can increased and power consumption can reduced.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 1:
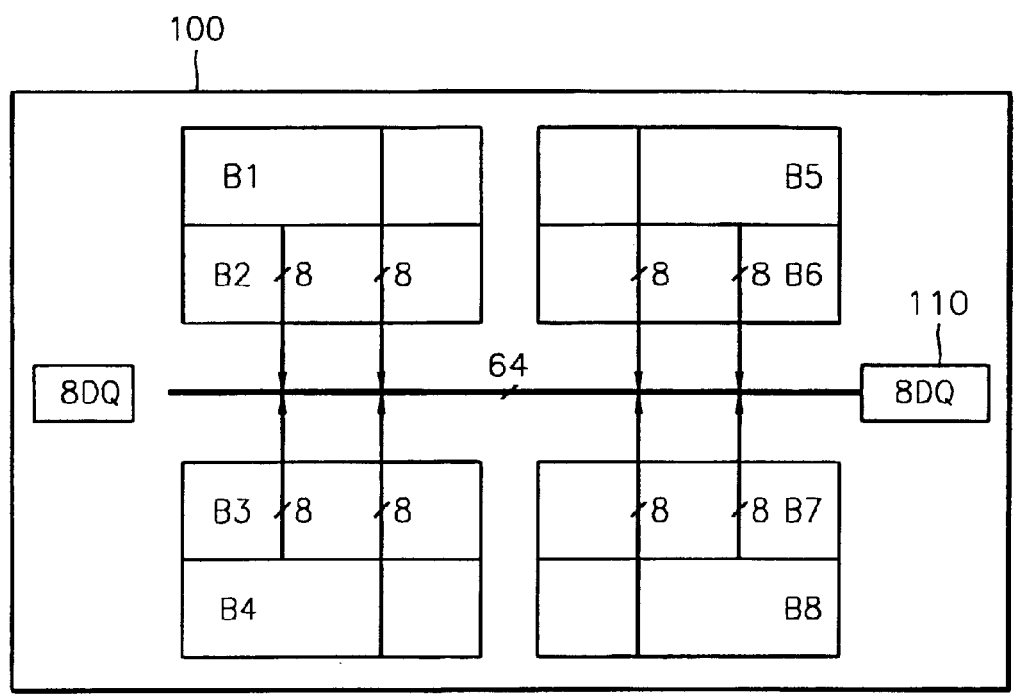
FIG. 1 is a diagram of the architecture of a memory device according to a first embodiment of the present invention.

FIG. 1 shows a memory device according to a first embodiment of the present invention. The memory device has a memory architecture with 8 DQ pins 110 for inputting and outputting×8 data. Describing the memory architecture in detail, 8 data output from each of first through eighth memory banks B1 through B8 are output in sequence to the 8 DQ pins via 64 data bus lines. Here, the 8 data output from each of the first through eighth memory banks B1 through B8 are stored in a register and are synchronized with a clock signal in order to be output one-by-one in a pipeline type operation.

Figure 2:
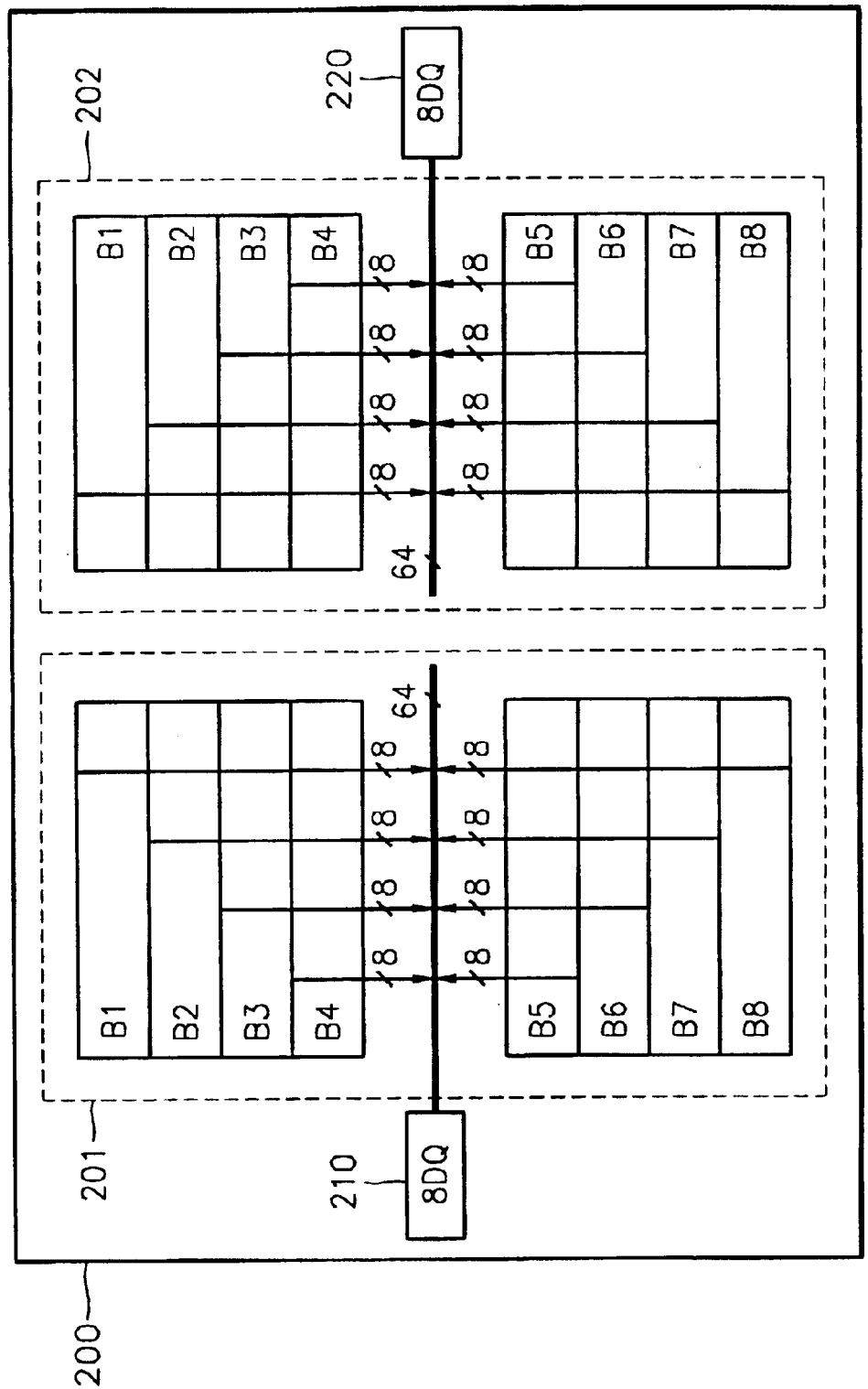
FIG. 2 is a diagram of the architecture of a memory device according to a second embodiment of the present invention.

FIG. 2 shows an example of a memory architecture with 16 data pins for inputting and outputting×16 data using the memory device shown in FIG. 1. Compared to the memory architecture shown in FIG. 1, the memory architecture shown in FIG. 2 includes two memory groups, each of which is composed of first through eighth memory banks B1 through B8. Each of the first through eighth memory banks B1 through B8 in a first memory group 201 is selected with one of the first through eighth memory banks B1 through B8 in a second memory group 202. That is, the first memory bank B1 in the first memory group 201 is selected with the first memory bank B1 in the second memory bank 202, the second memory bank B2 in the first memory group 201 is selected with the second memory bank B2 in the second memory group 202, and so on.

The 8 data output from each of the first through eighth memory banks B1 through B8 of the first memory group 201 are output to the 8 DQ pins 210 via 64 data bus lines in the first memory group 201. The 8 data output from each of the first through eighth memory banks B1 through B8 of the second memory group 202 are output to 8 DQ pins 220 via 64 data bus lines in the second memory group 202.

Supposing that there are 1024 (hereinafter referred to as "1K") memory cells connected to one word line in each of the first through eighth memory banks B1 through B8 in the memory architecture shown in FIG. 1, then, the page size of the memory architecture of FIG. 1 is 1 KB. Also, if one word line in each of the first through eighth memory banks B1 through B8 is enabled, 1K sense amplifiers (not shown) sense data of 1K memory cells. Since the first through eighth memory banks B1 through B8 in the memory architecture of FIG. 2 are respectively selected in the first memory group 201 and the second memory group 202 at the same time, the number of memory cells connected to one word line, i.e., the page size, is 2 KB. As a result, if one word line in each of the first through eighth memory banks B1 through B8 is enabled, 2K sense amplifiers (not shown) sense data of 2K memory cells.

Figure 3:
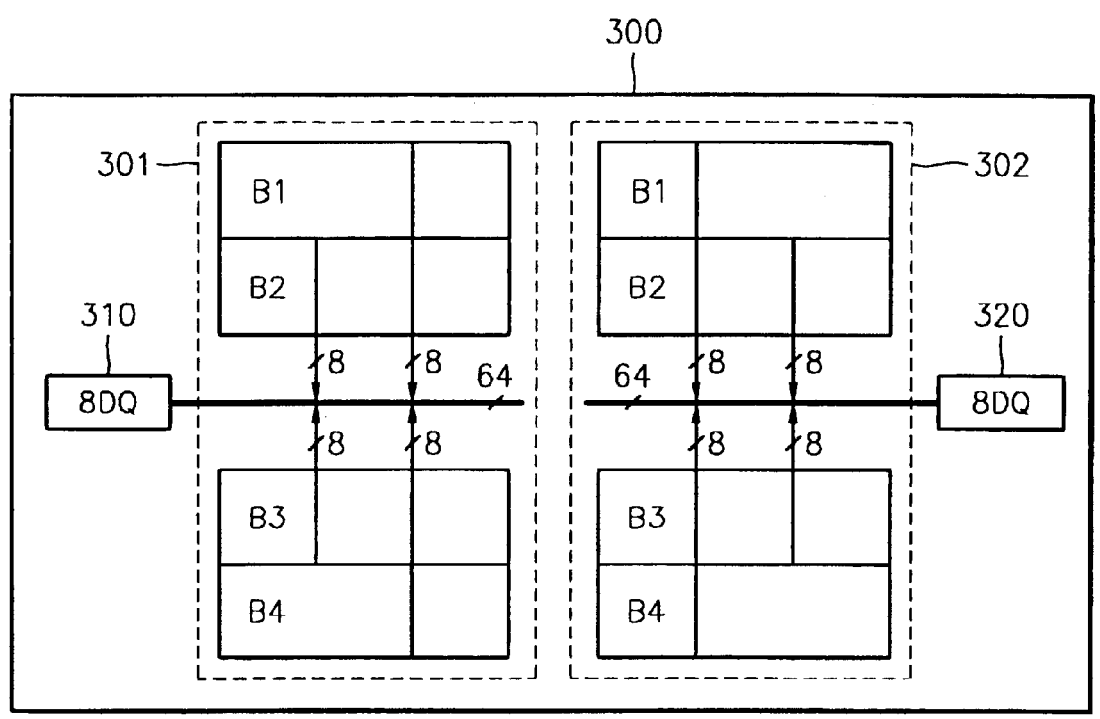
FIG. 3 is a diagram of the architecture of a memory device according to a third embodiment of the present invention.

FIG. 3 shows another example of a memory architecture with 16 data pins for inputting and outputting×16 data using the memory device of FIG. 1. The memory architecture of FIG. 1 includes the first through eighth memory banks B1 through B8. The 8 data output from each of the first through eighth memory banks B1 through B8 are output to the 8 DQ pins 110 via 64 data bus lines. The page size of the memory architecture is 1 KB. However, the memory architecture of FIG. 3 includes two memory groups of four memory banks B1 through B3. The 8 data are output from each of the memory banks B1 through B4 in first and second memory groups 301 and 302. The 8 data are output to the 16 DQ pins 310 and 320 via 64 data bus lines, as already presented for the memory architecture of FIG. 1. Here, the number of substantially used data bus lines is 32. In other words, 8 data output from each of first through fourth memory banks B1 through B4 in a first memory group 301 are output to the 8 DQ pins 310 via 64 data bus lines in the first memory group 301. The 8 data output from each of first through fourth memory banks B1 through B4 in a second memory group 302 are output to the 8 DQ pins 320 via 64 data bus lines in the second memory group 320.

Accordingly, since the memory architecture of FIG. 3 has half of the memory banks of the architecture of FIG. 2, the defective cells in each memory bank can be replaced with redundant cells. Thus, redundancy flexibility increases while power consumption decreases with a reduction in the number of memory banks.

One memory device according to one embodiment of the present invention includes the memory architecture of FIG. 1 together with the memory architecture of either FIG. 2 or FIG. 3. Thus, the two memory architectures of the memory device may be changed with each other using a design option. That is, if one memory device includes the memory architecture of FIG. 1 and the memory architecture of FIG. 2, then the memory architecture of FIG. 1 or the memory architecture of FIG. 2 may be selected using a selection process. The selection process can be either a method of connecting or cutting metal, a fuse, or a bonding means.

Accordingly, in memory architectures of the present invention, the page size and the number of memory banks are adjusted by a design option. Thus, the present invention provides a memory device capable of increasing redundancy flexibility and reducing power consumption.

If a memory system is composed of a memory device of the present invention including the memory architecture of FIG. 1 and the memory architecture of either FIG. 2 or FIG. 3, a memory module including several memory devices set by a selection process as the memory architecture of FIG. 1 may be used together with a memory module including a plurality of memory devices set by a selection process as the memory architecture of either FIG. 2 or FIG. 3.

Figure 4:
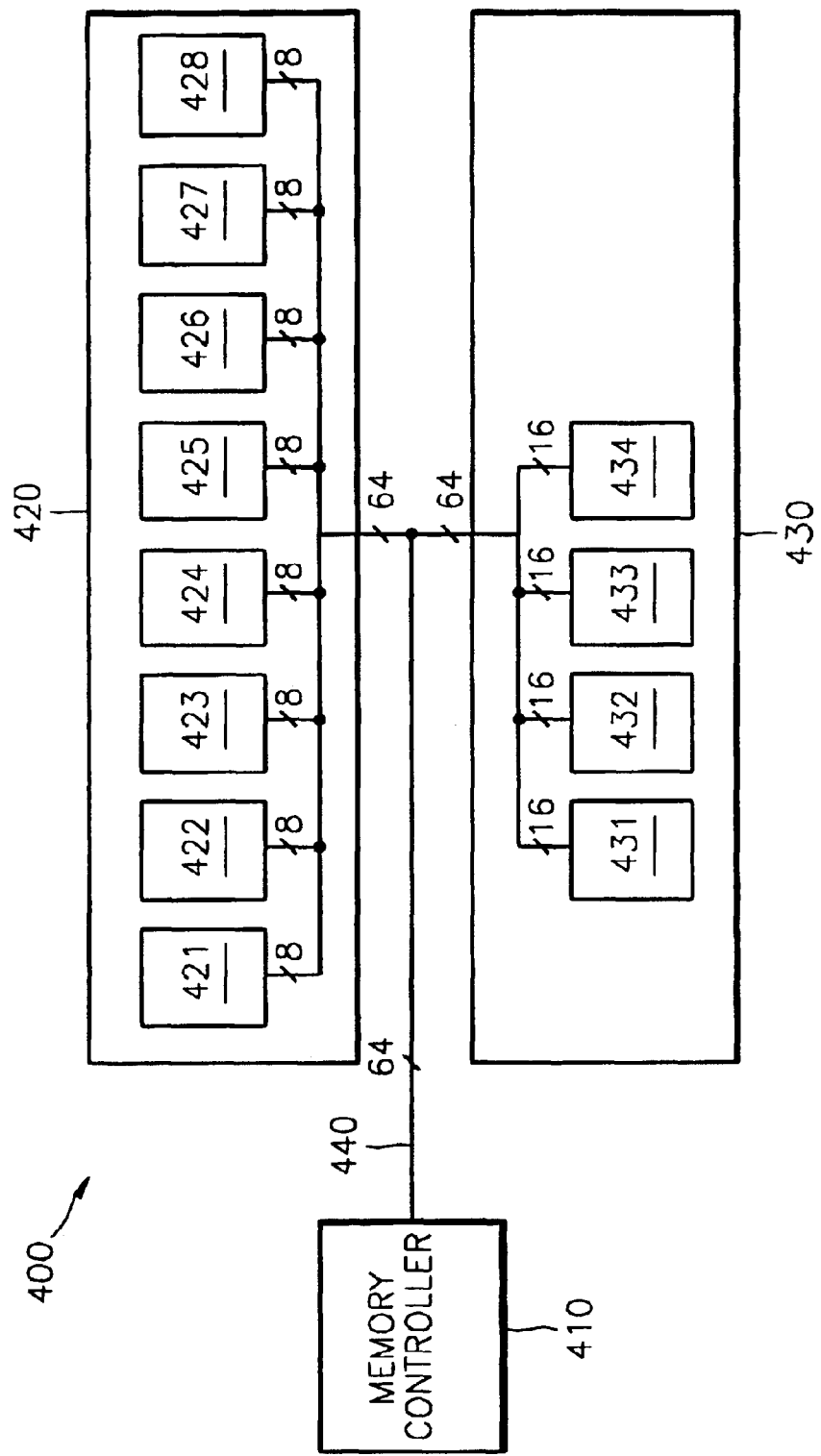
FIG. 4 is a diagram of a memory system according to the present invention.

FIG. 4 shows a memory system according to one embodiment of the present invention. Referring to FIG. 4, a memory system 400 includes a memory controller 410, a first memory module 420, and a second memory module 430. A command bus, an address bus, a clock bus, and a data bus are connected between the memory controller 410 and the first and second memory modules 420 and 430. 64 data bus lines 440 will be described as a representative example.

The first memory module 420 includes 8 memory devices 421 through 428 set by a selection process as the memory architecture 100 of FIG. 1. The 8 DQ pins of each of the memory devices 421 through 428 are respectively connected to 64 data bus lines 440. The second memory module 430 includes four memory devices 431 through 434 set by a selection process as the memory architecture of either FIG. 2 or FIG. 3. The 16 DQ pins of each of the four memory devices 431 through 434 are respectively connected to 64 data bus lines 440.

As described above, in a memory device of the present invention, the page size and the number of memory banks are adjusted by a design option. Thus, the memory architecture is modified, redundancy flexibility is increased and power consumption is reduced.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A semiconductor memory device having different memory architectures, the semiconductor memory device comprising:

a first memory architecture having p banks, a page size of m/2 bytes of m/2 memory cells connected to one word line in each of the banks, and n/2 data terminals DQ; and a second memory architecture having p banks, a page size of m bytes, and n data terminals;

wherein one of the first memory architecture and the second memory architecture is selected using an option process, the option process being realized by one of a bonding, a mask pattern, and a fuse.

2. A semiconductor memory device having different memory architectures, the semiconductor memory device comprising:

a first memory architecture having p banks, a page size of m/2 bytes of m/2 memory cells connected to one word line in each of the memory banks, and n/2 data terminals DQ; and a second memory architecture having p/2 banks, a page size of m bytes, and n data terminals.

3. The semiconductor memory architecture of claim 2, wherein if the first memory architecture includes p/2 memory banks, the second memory architecture includes p memory banks.

4. The semiconductor memory architecture of claim 2, wherein one of the first memory architecture and the second memory architecture is selected using an option process.

5. The semiconductor memory architecture of claim 4, wherein the option process is realized by one of a bonding, a mask pattern, and a fuse.

6. A memory system comprising:

a memory controller;

a first memory module connected to the memory controller via data bus lines and including i memory devices; and a second memory module connected to the memory controller via the data bus lines and including i/2 memory devices, wherein each of the memory devices of each of the first and second memory modules comprises:

a first memory architecture having p memory banks, a page size of m/2 bytes of m/2 memory cells connected to one word line in each of the memory banks, and n/2 data terminals DQ; and a second memory architecture having p memory banks, a page size of m bytes, and n data terminals DQ, wherein the first memory architecture is selected by the memory devices of the first memory module, and the second memory architecture is selected by the memory devices of the second memory module.

7. The memory system of claim 6, wherein any one of the first memory architecture and the second memory architecture is selected in each of the memory devices of the first and second memory modules using an option process.

8. The memory system of claim 7, wherein the option process can be realized by one of a bonding, a mask pattern, and a fuse.

9. A memory system comprising:

a memory controller;

a first memory module connected to the memory controller via data bus lines and including i memory devices; and a second memory module connected to the memory controller via the data bus lines and including i/2 memory devices, wherein each of the memory devices of each of the first and second memory modules comprises:

a first memory architecture having p memory banks, a page size of m/2 bytes of m/2 memory cells connected to one word line in each of the memory banks, and n/2 data terminals DQ; and a second memory architecture having p/2 memory banks, a page size of m bytes, and n data terminals DQ, wherein the first memory architecture is selected by the memory devices of the first memory module, and the second memory architecture is selected by the memory devices of the second memory module.

10. The memory system of claim 9, wherein if the first memory architecture includes p/2 memory banks, the second memory architecture includes p memory banks.

11. The memory system of claim 9, wherein one of the first memory architecture and the second memory architecture is selected in each of the memory devices of the first and second memory modules using an option process.

12. The memory system of claim 11, wherein the option process is realized by one of a bonding, a mask pattern, and a fuse.

* * * * *